United States Patent
Radoiu et al.

(10) Patent No.: US 8,776,719 B2
(45) Date of Patent: Jul. 15, 2014

(54) MICROWAVE PLASMA REACTOR

(75) Inventors: Marilena Radoiu, Lyons (FR); James Robert Smith, Taunton (GB); Andrew James Seeley, Bristol (GB)

(73) Assignee: Edwards Limited, West Sussex (GB)

( * ) Notice: Subject to any disclaimer, the term of this patent is extended or adjusted under 35 U.S.C. 154(b) by 1334 days.

(21) Appl. No.: 11/990,257

(22) PCT Filed: Jul. 27, 2006

(86) PCT No.: PCT/GB2006/002794
§ 371 (c)(1),
(2), (4) Date: Aug. 12, 2009

(87) PCT Pub. No.: WO2007/020373
PCT Pub. Date: Feb. 22, 2007

(65) Prior Publication Data
US 2010/0006227 A1 Jan. 14, 2010

(30) Foreign Application Priority Data
Aug. 15, 2005 (GB) .................................. 0516695.4

(51) Int. Cl.
C23C 16/00 (2006.01)
C23F 1/00 (2006.01)
H01L 21/306 (2006.01)
H01J 37/32 (2006.01)

(52) U.S. Cl.
CPC ..... *H01J 37/32844* (2013.01); *H01J 37/32229* (2013.01); *H01J 37/32192* (2013.01); *Y02C 20/30* (2013.01)
USPC .............................. 118/723 MW; 156/345.41

(58) Field of Classification Search
USPC ......... 118/723 MW; 156/345.41; 315/111.21
See application file for complete search history.

(56) References Cited

U.S. PATENT DOCUMENTS

| 4,866,346 A | * | 9/1989 | Gaudreau et al. ........ 315/111.21 |
| 4,893,584 A | * | 1/1990 | Doehler et al. ....... 118/723 MW |
| 4,970,435 A | | 11/1990 | Tanaka et al. |
| 5,144,199 A | | 9/1992 | Taki et al. |

(Continued)

FOREIGN PATENT DOCUMENTS

| EP | 1 093 847 A1 | 4/2001 |
| JP | 59-103340 | 6/1984 |

(Continued)

OTHER PUBLICATIONS

Tsuchimoto Takashi, Sakumichi Kuniyuki, Suzuki Keizou; English language abstract of Japanese Patent No. JP 59103340 A, entitled "Plasma Processing Apparatus," Hitachi Ltd; Jun. 14, 1984.

(Continued)

*Primary Examiner* — Rakesh Dhingra
(74) *Attorney, Agent, or Firm* — Shumaker & Sieffert, P.A.

(57) ABSTRACT

A microwave plasma reactor (10) comprises a reactor chamber, a microwave resonant cavity (14) located within the reactor chamber, a waveguide (16) for conveying microwave radiation to the resonant cavity, the waveguide having a convergent tapered portion, means for forming an electromagnetic standing wave within the resonant cavity from the microwave radiation for initiating and sustaining a plasma within the resonant cavity, the resonant cavity having a gas inlet and a gas outlet, and conduit means extending from the gas outlet for containing a plasma conveyed from the resonant cavity with a gas flowing from the gas inlet to the gas outlet.

32 Claims, 5 Drawing Sheets

(56) References Cited

U.S. PATENT DOCUMENTS

| | | | |
|---|---|---|---|
| 5,310,426 A | | 5/1994 | Mori |
| 5,349,154 A | * | 9/1994 | Harker et al. ............... 117/102 |
| 5,418,430 A | * | 5/1995 | Bayliss .................. 315/111.21 |
| 5,453,125 A | | 9/1995 | Krogh |
| 5,517,085 A | | 5/1996 | Engemann et al. |
| 5,603,771 A | * | 2/1997 | Seiberras et al. ...... 118/723 ME |
| 5,825,485 A | * | 10/1998 | Cohn et al. ................ 356/316 |
| 5,874,705 A | * | 2/1999 | Duan ..................... 219/121.43 |
| 5,902,404 A | * | 5/1999 | Fong et al. ............ 118/723 ME |
| 5,973,289 A | * | 10/1999 | Read et al. ............. 219/121.48 |
| 6,298,806 B1 | | 10/2001 | Moisan et al. |
| 6,712,927 B1 | * | 3/2004 | Grimbergen et al. .... 156/345.24 |
| 7,159,536 B1 | * | 1/2007 | Grosse et al. ......... 118/723 MW |
| 2001/0019237 A1 | | 9/2001 | Ishii |
| 2002/0007912 A1 | * | 1/2002 | Kamarehi et al. ............ 156/345 |
| 2002/0020691 A1 | * | 2/2002 | Jewett et al. ............ 219/121.59 |

FOREIGN PATENT DOCUMENTS

| | | | | |
|---|---|---|---|---|
| JP | 6-53170 | 2/1994 | | |
| JP | 6-73567 | 3/1994 | | |
| JP | 6-112161 | 4/1994 | | |
| JP | 6-299357 | 10/1994 | | |
| WO | WO 0120640 | * 3/2001 | ............ | C23C 16/511 |
| WO | WO 2004/098246 A1 | 11/2004 | | |

OTHER PUBLICATIONS

Kawai Yoshinobu, Kojo Daiichi, Murata Masayoshi, Takeuchi Yoshiaki, Uda Kazutaka; English language abstract of Japanese Patent No. JP 6299357 A, entitled "Chemical Vapor Deposition Device by Electron Cyclotron Resonance Plasma," Mitsubishi Heavy Ind Ltd; Oct. 25, 1994.

Watanbe Seiichi, Furuse Muneo; English language abstract of Japanese Patent No. JP 6073567 A, entitled "Microwave Plasma Treatment Device," Hitachi Ltd; Mar. 15, 1994.

Yoshioka Takeshi, Tetsuka Tsutomu, Kazumi Hideyuki, Shirakawa Shinji, Kobayashi Kinya, Shima Kenzo, Suzuki Kazuo; English language abstract of Japanese Patent No. JP 6112161 A; entitled "Plasma Processor," Hitachi Ltd; Apr. 22, 1994.

Sagawa Seiji, English language abstract of Japanese Patent No. JP 6053170A, entitled "ECR PLasma Etcher," Nippon Electric Co; Feb. 25, 1994.

United Kingdom Search Report of Application No. GB 0516695.4; Date of mailing: Dec. 23, 2005; Claims searched: All; Date of Search: Dec. 22, 2005.

PCT Notification of Transmittal of the International Search Report and the Written Opinion of the International Searching Authority, or the Declaration of International Application No. PCT/GB2006/002794; Date of mailing: Oct. 23, 2007.

PCT International Search Report of International Application No. PCT/GB2006/002794; Date of mailing of the International Search Report: Oct. 23, 2006.

PCT Written Opinion of the International Searching Authority of International Application No. PCT/GB2006/002794; Date of mailing: Oct. 23, 2006.

* cited by examiner

MICROWAVE PLASMA REACTOR

FIELD OF THE INVENTION

The present invention relates to a microwave plasma reactor. The apparatus finds particular use in a plasma abatement system, although the invention is not limited to such systems.

BACKGROUND OF THE INVENTION $CF_4$, $C_2F_6$, $NF_3$ and $SF_6$ are commonly used in the semiconductor manufacturing industry, for example, in dielectric layer etching and chamber cleaning. Following the manufacturing or cleaning process there is typically a residual PFC content in the effluent gas stream pumped from the process tool. PFCs are difficult to remove from the effluent stream, and their release into the environment is undesirable because they are known to have relatively high greenhouse activity.

Plasma abatement has proved to be an effective method for degradation of PFCs to less damaging species. In the plasma abatement process, an effluent gas containing the species to be destroyed is caused to flow into a high density plasma and under the intensive conditions within the plasma the PFCs are subjected to impact with energetic electrons causing dissociation into reactive species which can combine with oxygen or hydrogen to produce relatively stable, low molecular weight by-products, for example, CO, $CO_2$ and HF, which can then be removed in a further treatment step.

In one form of previously known plasma abatement, the plasma is a microwave plasma. An example of a microwave plasma reactor is described in UK Patent no. GB 2,273,027. In that device, a microwave plasma is generated between two electrodes located in a chamber in closely opposed relationship, with one of the electrodes having an axial hole through which an excited gaseous medium is exhaust from the chamber.

In such a reactor, the microwave radiation is conveyed into the chamber from a microwave generator by a waveguide. In order to reduce the amount of microwave radiation reflected back into the microwave generator by the waveguide, the waveguide is provided with one or more tuning screws extending substantially orthogonally thereinto. By adjusting the amount by which each of the screws extends into the waveguide, the amount of microwave radiation reflected back into the microwave generator by the waveguide can be minimised. However, the presence of the tuning screws serves to reduce the energy absorption into the plasma.

SUMMARY OF THE INVENTION

The present invention provides a microwave plasma reactor comprising a reactor chamber, a microwave resonant cavity located within the reactor chamber, a waveguide for conveying microwave radiation to the resonant cavity, the waveguide having a convergent tapered portion, means for forming an electromagnetic standing wave within the resonant cavity from the microwave radiation for sustaining a plasma within the resonant cavity, the resonant cavity having a gas inlet and a gas outlet, and conduit means extending from the gas outlet for containing a plasma conveyed from the resonant cavity with a gas flowing from the gas inlet to the gas outlet.

BRIEF DESCRIPTION OF THE DRAWINGS

Preferred features of the present invention will now be described, by way of example only, with reference to the accompanying drawings, in which.

DETAILED DESCRIPTION OF THE INVENTION

Figure 1:
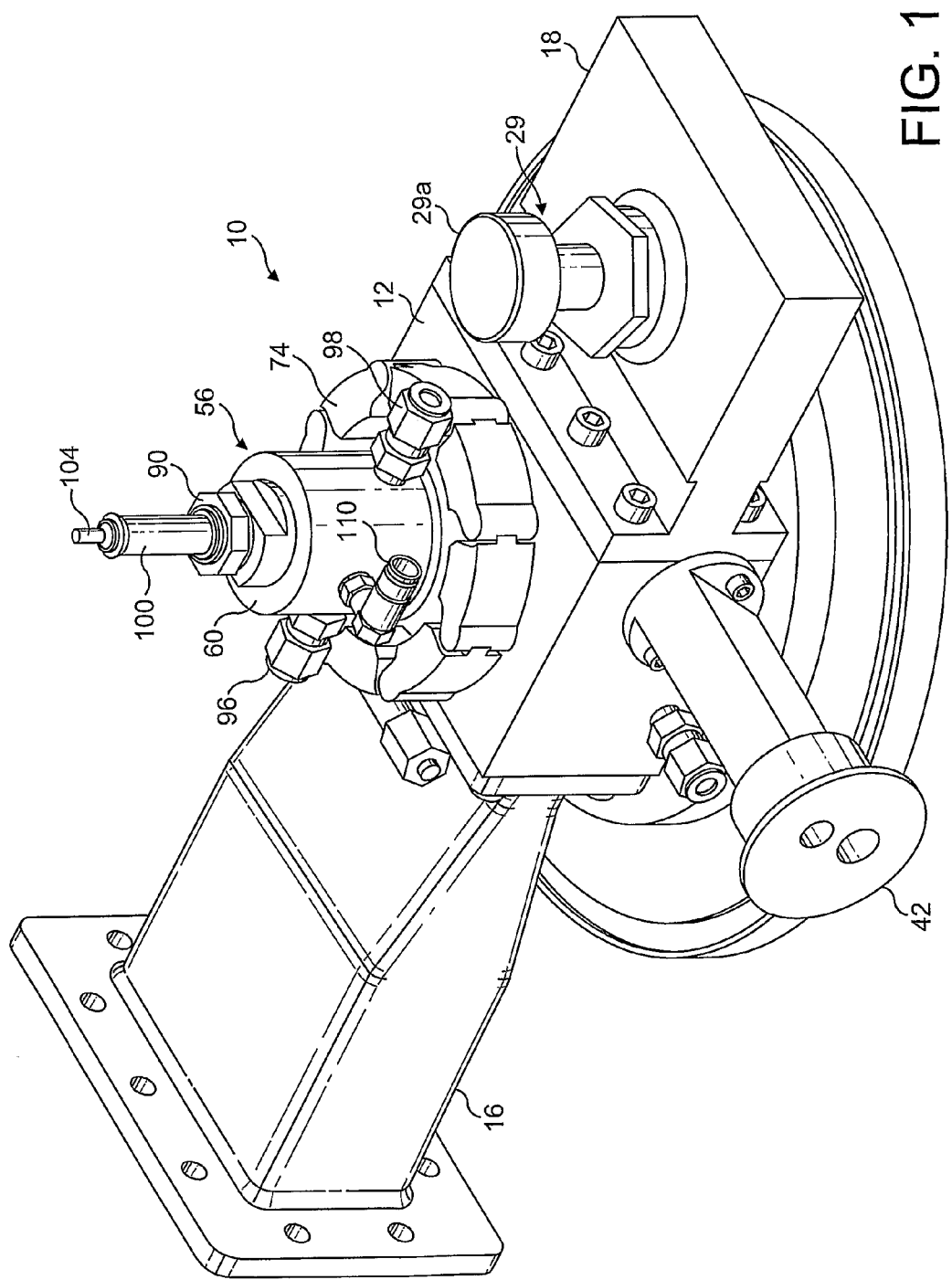
FIG. 1 is an external perspective view of a microwave plasma reactor.

With reference to FIGS. 1 to 4, a microwave plasma reactor 10 comprises an electrically conductive housing 12. The housing 12 is preferably formed from electrically conducting material, such as stainless steel, or may have internal electrically conducting surfaces. As illustrated, the housing 12 may have a rectangular cross-section. A slot 14 is formed in the housing 12, for example by machining, and extends across the width of the housing 12 to provide a resonant cavity of the reactor 10. One end of the resonant cavity 14 is connected to a waveguide 16 for conveying microwave radiation from a microwave generator (not shown) into the resonant cavity 14. The other end of the resonant cavity 14 is connected to a short circuit 18.

The waveguide 16 comprises a first, substantially rectangular body portion 20 having a height $h_1$ substantially parallel to the $TE_{01}$ electric field of the microwave radiation conveyed through the waveguide 16 to the resonant cavity 14, and a width w orthogonal to the electric field of the microwave radiation. The waveguide 16 also comprises a second, substantially rectangular body portion 22 facing the resonant cavity 14, the second body portion 22 having a height $h_2$ and a width w, where $h_2 < h_1$. In the illustrated example, the second body portion 22 has a height of approximately one third of the height of the first body portion 20.

The waveguide 16 further comprises a tapered, convergent portion 24 of width w located between the first and second body portions 20, 22. The tapered portion 24 comprises a first end surface 25a adjacent the first body portion 20 of height $h_1$ and width w, and a second end surface 25b adjacent the second body portion 22 of height $h_2$ and width w. The tapered portion 24 further comprises first and second side surfaces 25c, 25d extending between the end surfaces 25a, 25b and inclined at an acute angle to the second side surface 25b such that the first and second body portions 20, 22 are co-axial. The tapered portion 24 has a length/in the direction of propagation of the microwave radiation through the waveguide 16, where l is equal to approximately one half of the wavelength of the microwave radiation.

The short circuit 18 provides an extension of the waveguide 16 on the opposite side of the resonant cavity 14. The short circuit 18 comprises a chamber 27 defined in part by an end plate 26 that is distanced from the end of the second portion 22 of the waveguide 16 such that the incident microwave radiation is reflected by the end plate 26 to form an electromagnetic standing wave within the resonant cavity 14. The position of the end plate 26 relative to the end of the second portion 22 of the waveguide 16 may be adjustable.

The short circuit 18 comprises a tuner 29 spaced from the end plate 26 for tuning the short circuit 18. In the illustrated example, the tuner comprises a screw 29 threaded into the top surface of the short circuit 18 such that the body of the screw extends into the chamber 27 substantially perpendicular to the direction of propagation of the microwave radiation through the chamber 27. By turning the head 29a of the screw 29, the end of the screw 29 can be raised or lowered within the chamber 27 to tune the short circuit 18.

The resonant cavity 14 houses two dielectric plate members 28, 30, preferably formed from PTFE or other suitable material for retaining adequate corrosion resistance whilst being substantially transparent to the microwave radiation conveyed through the resonant cavity 14. Each plate member 28, 30 has a flat sidewall portion 32 extending orthogonally to the direction of propagation of the microwave radiation through the resonant cavity 14, and a curved sidewall portion 34 which define in part a substantially cylindrical gas chamber 36 within the resonant cavity 14. The gas chamber 36 may have a circular or elliptical cross-section.

Each plate member 28, 30 has a first bore 38 formed therein providing a gas inlet into the gas chamber 36 of the resonant cavity 14. In the illustrated reactor 10, one of the bores 38 is aligned with a gas inlet port 40 formed in a sidewall of the housing 12 for receiving gas from a first gas conduit 42 mounted on the housing 12. A second gas port may optionally be formed in the opposite sidewall of the housing 12 for receiving gas from a second gas conduit, which gas may be the same as, or dissimilar to, the gas entering the gas chamber 36 from the first gas conduit 42. Each gas inlet is preferably configured so that gas enters the gas chamber 36 from the first gas conduit 42 substantially tangentially, so that the gas swirls inwardly within the gas chamber 36 towards the centre of the gas chamber 36. A gas outlet port 44 is formed in the base of the housing 12 for conveying gas from the gas chamber 36 to a second gas conduit 46. The gas outlet port 44 extends transversely of, and is preferably co-axial with, the gas chamber 36.

Each plate member 28, 30 also has a smaller second bore 48 formed therein. One of the bores 48 is aligned with an aperture 50 formed in a sidewall of the housing and closed by a transparent cover plate 52 to provide an inspection window for enabling a user to observe a plasma generated within the gas chamber 36 of the resonant cavity 14 during use of the reactor 10.

A cylindrical bore 54 is also formed in the housing 12, the bore 54 extending transversely of the resonant cavity 14 and defining with the resonant cavity a reactor chamber of the reactor 10. The bore 54 is preferably substantially co-axial with the gas chamber 36 and gas outlet port 44. The bore 54 receives an electrically conducting assembly 56. The assembly 56 comprises an electrically conducting member 58 and a holder 60 for holding the electrically conducting member 58.

Figure 5:
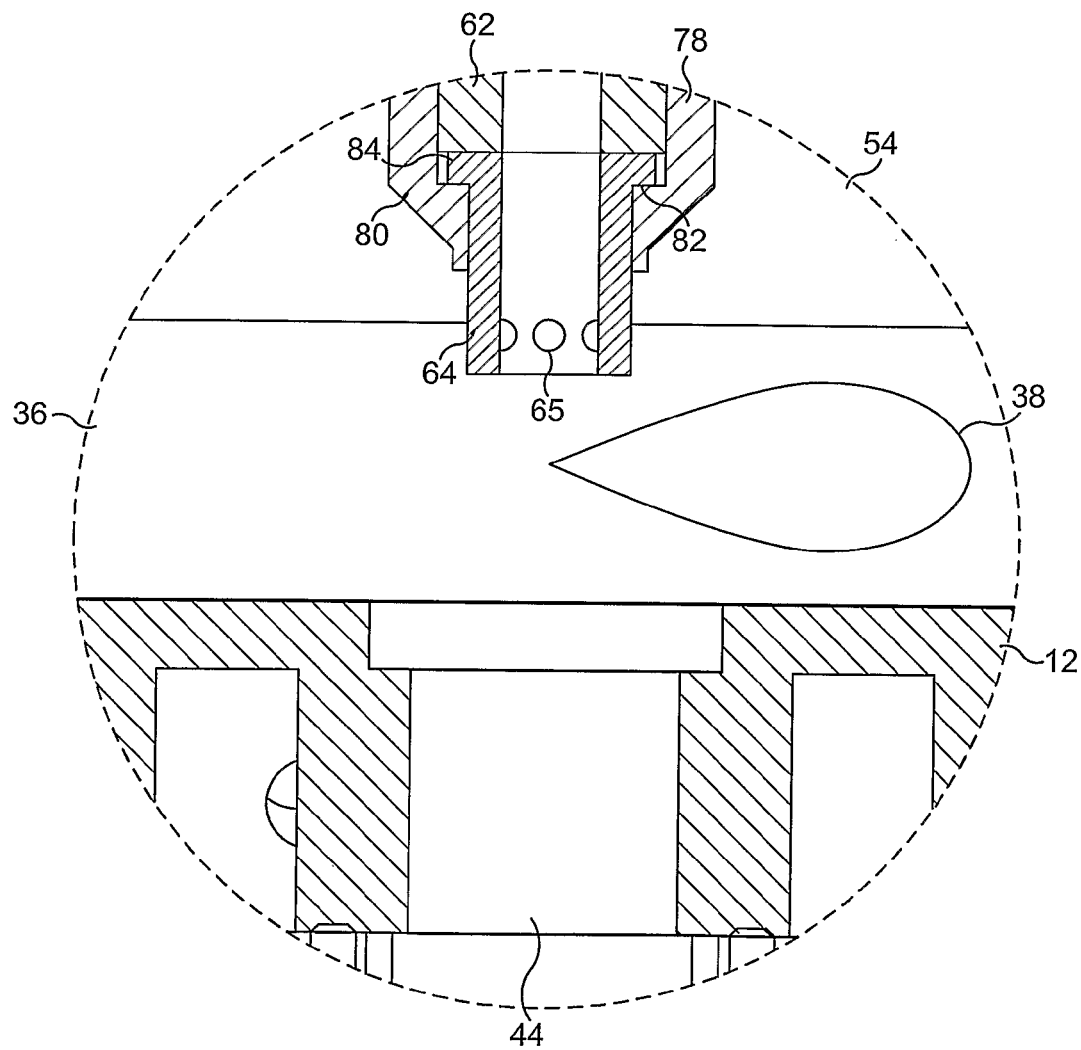
FIG. 5 is an enlarged view of region C identified in FIG. 3.

The electrically conducting member 58 comprises an elongate tube 62, which may be formed from copper or other electrically conducting material, and which engages a tubular tip 64, as illustrated in more detail in FIG. 5. The tip 64 is preferably formed from corrosion and heat resistant material, such as tungsten or a tungsten alloy, for example an alloy of tungsten and lanthanum. The tip 64 may be provided with a plurality of apertures 65 extending thereabout to enable a gas flowing between the gas inlet 38 and the gas outlet 44 to pass radially through the tip 64 and thereby enhance the cooling of the tip 64. The apertures 65 are preferably dimensioned so that microwave radiation passes through the apertures 65.

Figure 3:
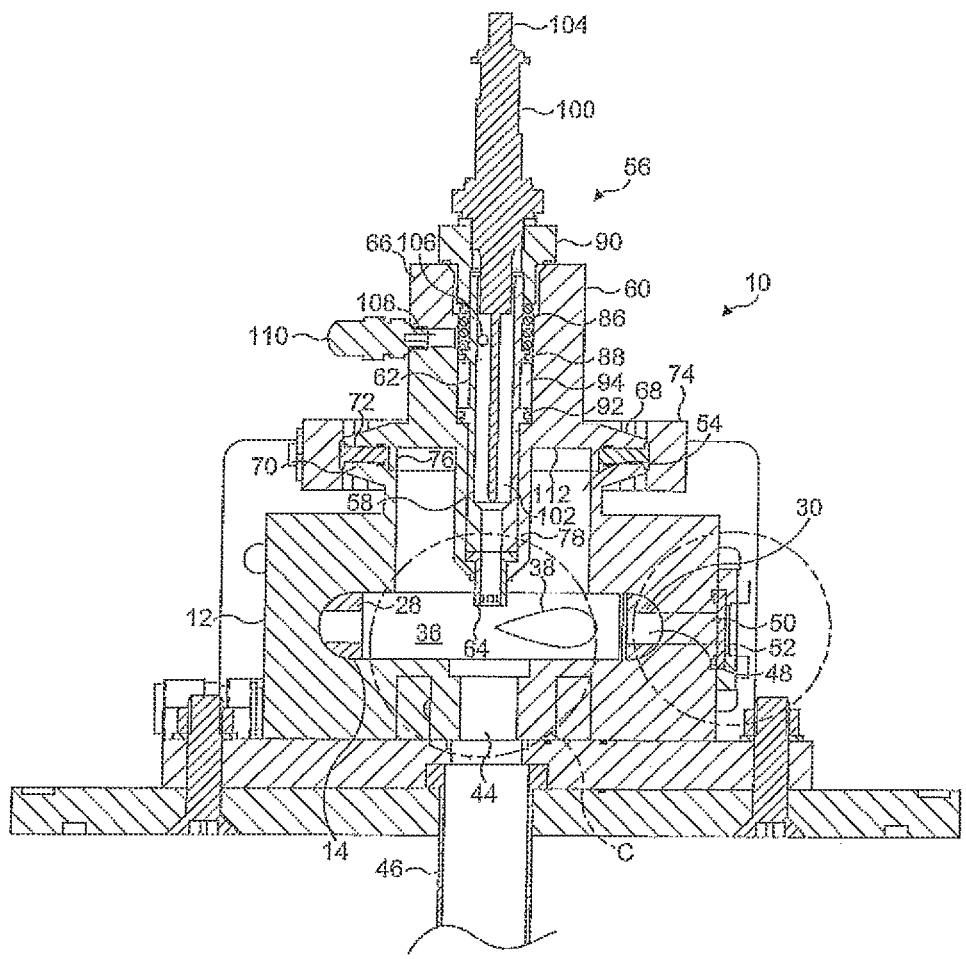
FIG. 3 is a cross-sectional view through the reactor along line A-A of FIG. 2.
Figure 4:
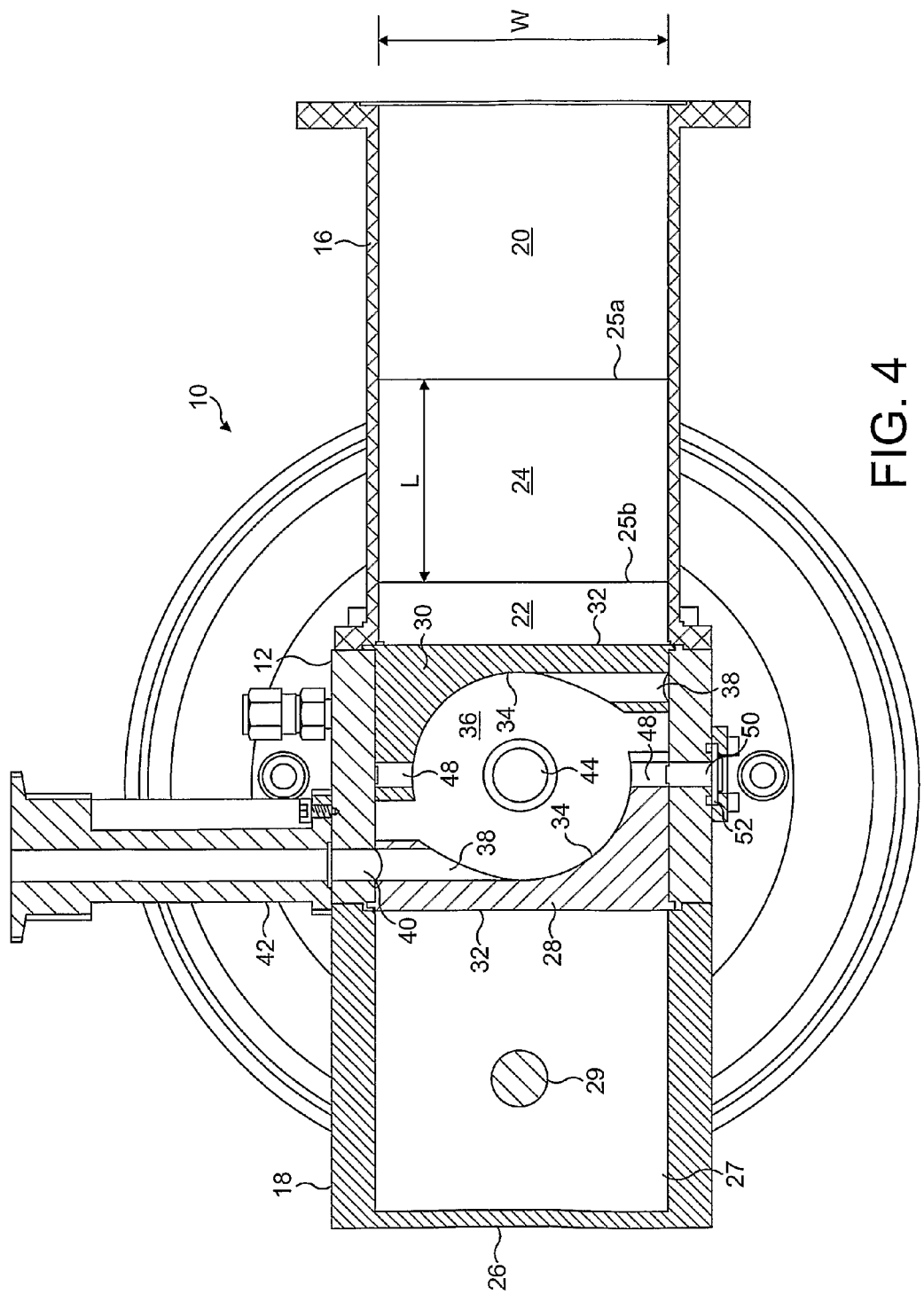
FIG. 4 is a cross-sectional view through the reactor along line B-B of FIG. 2.

The holder 60 is preferably formed from electrically conducting material, such as stainless steel or anodised aluminium. The electrically conducting member 58 and holder 60 are preferably at electrical ground during use of the reactor 10. The holder 60 has a hollow interior within which the tube 62 and tip 64 of the electrically conducting member 58 are preferably a sliding fit. The holder 60 comprises a first body portion 66 having an outwardly extending skirt 68, which is located on a flanged opening 70 of the bore 54 of the housing 12. An O-ring 72 is provided between the skirt 68 and the flanged opening 70 to form an air-tight seal, the skirt 68 being clamped to the flanged opening 70 by a clamp chain 74 extending thereabout. As illustrated in FIG. 3, the O-ring 72 is preferably located outside of the reactor chamber and therefore outside of the electromagnetic field generated therein, and may extend about an annular ring 76 depending downwardly from the skirt 68, the annular ring having an inner diameter that is substantially equal to the diameter of the bore 54, and which makes electrical contact with the housing 12. Alternatively, the base of the skirt 68 may make electrical contact with the housing 12.

The holder 60 further comprises a second, elongate body portion 78 that extends into the bore 54. The second body portion 78 of the holder 60 terminates with a conical projection 80, which preferably does not protrude into the gas chamber 36. The internal diameter of the second body portion 78 decreases at the conical projection 80 to provide a shoulder 82 that engages a rim 84 of the tip 64 to retain the tip 64 within the holder 60. The second body portion 78 of the holder 60 is preferably integral with both the first body portion 66 and the skirt 68.

As illustrated in FIG. 5, the tip 64 preferably protrudes into the gas chamber 36. The length of the tip 64, and/or the length of the second body portion 78 of the holder 60, is preferably chosen so that the tip 64 extends a predetermined distance into the standing wave generated within the resonant cavity 14 depending on the frequency of the microwave radiation supplied to the resonant cavity 14.

The tube 62 is preferably held in electrical contact with the holder 60. As illustrated, a metal spring 86 or other electrically conducting item, may be located within the holder 60 such that one end of the spring 86 engages a first annular projection 88 formed on the tube 62 and the other end of the spring 86 engages a metallic lock nut 90 threaded into the holder 60.

The tube 62 has a second annular projection 92 spaced from the first annular projection 88 to define an annular channel 94 between the holder 60 and the tube 62. A flow of cooling water is supplied to the annular channel 94, the water being supplied to the annular channel 94 through a coolant inlet port 96 passing through the holder 60, and being exhausted from the annular channel 94 through a coolant outlet port 98 passing through the holder 60 and located substantially opposite the coolant inlet port 96.

Depending on the power of the electromagnetic radiation conveyed to the resonant cavity, the intensity of electric field created within the resonant cavity 14 may be insufficient to ignite a plasma within the gas chamber 36. Therefore, a glow-discharge electrode assembly 100 may be housed within the electrically conducting member 58. The electrode assembly 100 comprises a plasma-ignition, glow-discharge electrode 102, which is in the form of an elongate, high voltage electrode located concentrically within, but spaced from, the tube 62 of the electrically conducting member 58. A connector 104 connects the electrode 102 with a power supply. The electrode 102 may be threaded into a conformingly-threaded aperture located concentrically with the lock nut 90. A gas inlet 106 is formed within the tube 62 for receiving a flow of a glow-discharge gas, such as nitrogen, a noble gas, or any other substantially inert and ionisable gas, from a gas inlet port 108 extending radially through the first body portion 66 of the holder 60. The gas inlet port 108 receives the glow-discharge gas from a connector 110 attached to the holder for connecting the gas inlet port 108 to a source of the glow-discharge gas. The gas inlet 106 is preferably arranged tangentially with respect to the bore of the tube 62 of the electrically conducting member 58 to promote formation of a helical flow path around electrode 102 generally downwardly towards the tip 64 of the electrically conducting member 58.

As an alternative to providing a glow-discharge electrode assembly, the microwave generator may be configured such that the power of the electromagnetic field is initially relatively high, for example, around 6 kW for between 1 and 5 seconds, to ignite a plasma within the gas chamber 36. The microwave generator may be configured to then reduce the power of the microwave radiation, for example to between 2 and 3 kW, or to any other power sufficient to sustain the plasma within the gas chamber 36.

Figure 2:
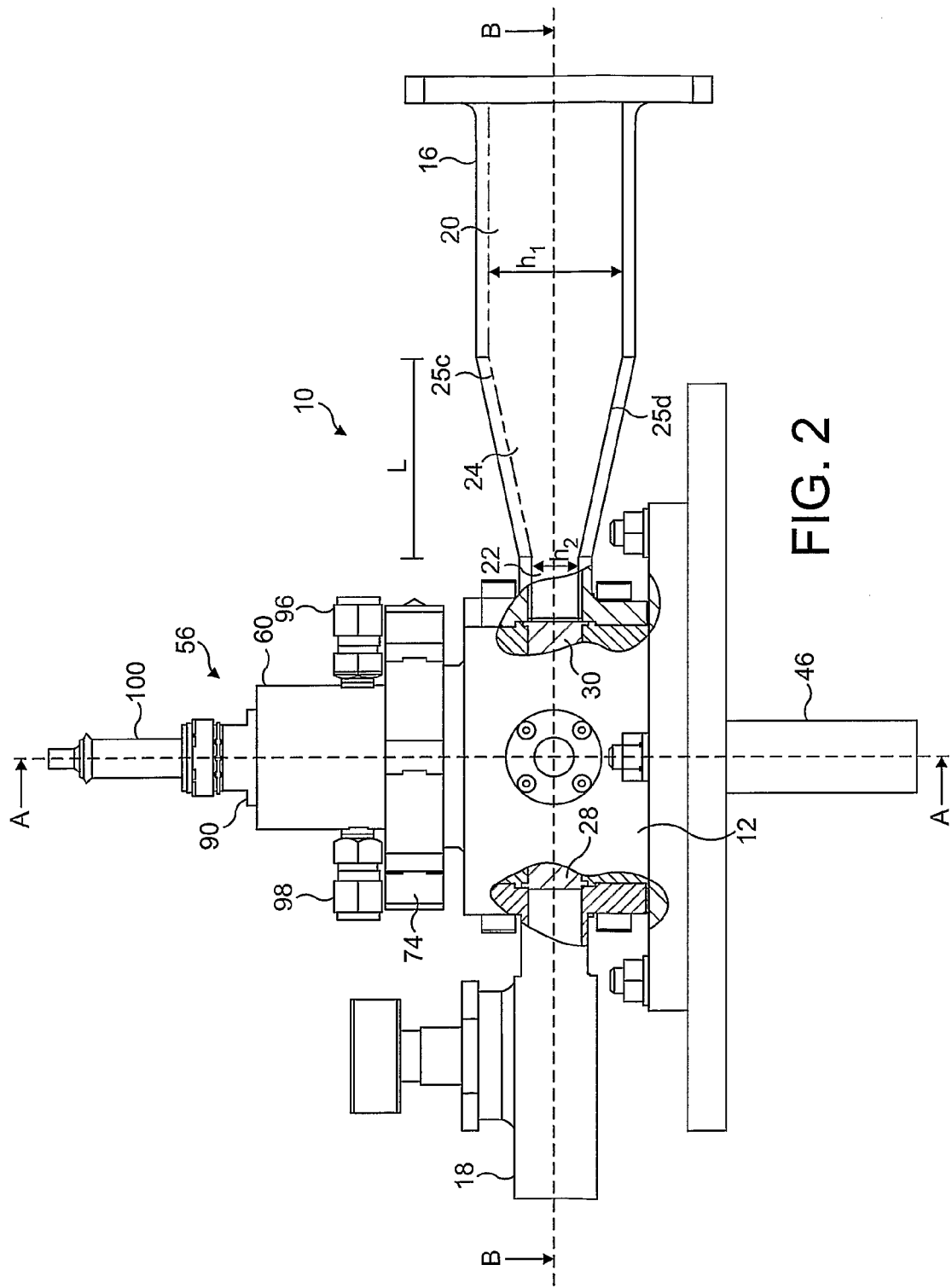
FIG. 2 is a side view of the reactor of FIG. 1.

As illustrated in FIG. 2, when the holder 60 is mounted on the housing 12, the electrically conducting member 58 extends into the bore 54 substantially perpendicular to the direction of propagation of the microwaves through the gas chamber 36, and is substantially co-axial with both the gas chamber 36 and the gas outlet port 44. The tip 64 of the electrically conducting member 58 is preferably located at a maximum intensity of the electromagnetic field formed within the resonant cavity 14 during use of the reactor 10.

Means may be provided for maintaining the gas chamber 36 at an elevated temperature, preferably at a temperature between 20 and 150° C., during use of the reactor 10. For example, the gas chamber 36 may be heated, insulated or provided with restricted cooling to maintain the gas chamber 36 at or around the desired elevated temperature.

During normal use of the reactor 10, a flow of cooling water is supplied to the annular channel 94. A gas is pumped into gas chamber 36 through the gas inlet port 40, flows spirally within the gas chamber 36 and passes beneath the tip 64 of the electrically conducting member 58 before leaving the gas chamber 36 through the gas outlet port 44 and entering the second gas conduit 46.

Microwave radiation is fed into the resonant cavity 14, and thus into the gas chamber 36, for a magnetron by the waveguide 16. The end plate 26 of the short circuit 18 reflects the microwaves to form a standing wave within the resonant cavity 14, with the tip 64 of the electrically conducting member 58 intensifying the electric field within the gas chamber 36. The tapered portion 24 of the waveguide 16 serves to inhibit the transmission and reflection of microwave radiation from the interface between the first and second body portions 20, 22 of the waveguide 16 whilst maximising the energy absorption of the plasma. The geometry and position of the lower surface 112 of the skirt 68 of the holder 60 relative to the tip 64 of the electrically conducting member 58 is chosen so that the lower surface 112 of the skirt 68 provides, with the inner surface of the bore 54 of the housing 12 and the outer surface of the second body portion of the holder 60, a co-axial tuner for matching the impedance in the plane of the electrically conducting member 58 to the impedance of the waveguide 16 at the frequency of the microwave radiation.

When a glows-discharge electrode assembly 100 is used to ignite a plasma within the gas chamber 36, the glow-discharge gas is caused to flow through the gas inlet port 106 of the tube 62 and into the bore of the tube 62. A low-voltage, high-current source is connected to the electrode 102, and a high voltage is applied temporarily to the electrode 102. The high voltage results in a corona discharge through the glow-discharge gas from the tip of the electrode 102 towards a proximal portion of the tube 62. That corona discharge provides a path through which a large current from the low voltage source can flow to ground. Flow of the large current causes formation of a glow discharge in the glow-discharge gas. The glow discharge thus formed is caused by the flow of the glow-discharge gas within the tube 62 to move from the tip 64 of the electrically conducting member 58 into the gas chamber 36. Microwave radiation within the gas chamber 36 is able to couple efficiently to the glow discharge and, in typically less than one second, the plasma ignites, leading to a stable microwave plasma which can be maintained by means of the microwave radiation supplied to the gas chamber 36 alone after the power supply to the electrode 102 is switched off (typically within two or three seconds).

The plasma initiated within the gas chamber 36 is carried out from the gas chamber 36 through the gas outlet port 44 with the gas flowing through the gas chamber 36, and is contained within the second gas conduit 46. The plasma thus resembles a flame generated beneath the tip 64 and extending out through the gas outlet port 44 into the second gas conduit 46. Due to the high temperature created within the second gas conduit 46 during use of the reactor 10, a coolant such as water may be sprayed over the outer surface of the second gas conduit 46 to cool the second gas conduit 46.

The microwave plasma generated within the gas chamber 36 may be used for a number of purposes. For example, the plasma may be used to destroy halogenated species, such unused perfluorinated and/or hydrofluorocarbon chamber cleaning and etching gases, silane or ammonia contained within the gas stream passing through the chamber. A reactant such as $H_2$ or $H_2O$ for reacting with these gases may be supplied to the gas chamber 36 with the glow-discharge gas for reacting with the gases within the plasma generated beneath the tip 64 of the electrically conducting member 58. Where the gases to be destroyed are chemically incompatible, the gas chamber 36 may be provided with a plurality of gas inlets, as described above, so that the incompatible gases may be conveyed separately to the gas chamber 36.

The presence of the tapered portion of the waveguide serves to tune the waveguide to inhibit the reflection of microwave radiation within the waveguide without reducing the energy absorption into the plasma generated within the resonant cavity.

The tapered portion of the waveguide is preferably located adjacent the chamber, and preferably has a length in the direction of propagation of microwave radiation therethrough equal to approximately one half of the wavelength of the microwave radiation.

The tapered portion of the waveguide preferably has a first, preferably substantially rectangular end surface for receiving the microwave radiation and having a first height substantially parallel to the $TE_{01}$ electric field of the microwave radiation, and a second, preferably substantially rectangular, end surface opposite the first end surface and having a second height smaller than the first. The height of the second end surface is preferably substantially equal to the height of the resonant cavity. By reducing the height of the waveguide from the first to the second height, the intensity of the electric field is increased. The tapered portion of the waveguide preferably comprises two convergent side surfaces each extending between and being inclined at an acute angle to the first end surface.

For rectangular waveguides having approximately the same width orthogonal to electric field, the increase in the intensity of the electric field is directly proportional to the reduction in the height of the waveguide. The increase in the intensity of the electric field may be sufficient that a plasma can be generated within the resonant cavity from the microwave radiation alone.

Due to the containment of a plasma within the conduit means, means are preferably provided for cooling the conduit means. For example, means for spraying a coolant such water or other aqueous solution on to the outer surface of the conduit means may be provided to cool the conduit means.

The means for forming an electromagnetic standing wave within the resonant cavity preferably comprises a second chamber mounted on the reactor chamber opposite the waveguide for receiving the microwave radiation from the resonant cavity and having an end surface extending substantially perpendicular to the direction of propagation of the microwaves through the chamber for reflecting the microwave radiation back into the resonant cavity. In order to optimise energy absorption into the plasma sustained within the resonant cavity, the second chamber preferably houses tuning means spaced from the end surface of the second chamber. The tuning means may comprise an electrically conducting, preferably cylindrical tuner extending perpendicular to the direction of propagation of microwave radiation through the second chamber, and which is preferably moveable relative to the second chamber to tune the second chamber.

The resonant cavity preferably comprises at least one dielectric insert located therein defining a substantially cylindrical gas chamber for receiving gas from the gas inlet and conveying gas to the gas outlet, and wherein the gas outlet is substantially co-axial with the gas chamber. The gas chamber may have a circular or elliptical cross-section. The at least one dielectric insert may conveniently comprise two dielectric plate members each having a curved sidewall portion.

In order to increase the electric field within the resonant cavity, the reactor preferably comprises an electrically conducting member protruding into the electromagnetic field within the resonant cavity, preferably at a location at which the intensity of the electric field is at a peak, and preferably extending into the electromagnetic field substantially perpendicular to the direction of propagation of the microwaves through the reactor chamber. The inventors have found that the presence of a single electrically conducting member protruding into the resonant cavity can intensify the electric field to such an extent that a plasma can be ignited and sustained by the microwave radiation having a relatively low power, for example between 2 and 6 kW.

Due to possible erosion of the electrically conducting member during use of the reactor, the electrically conducting member preferably comprises a replaceable tip protruding into the resonant cavity. The tip is preferably formed from corrosion and heat resistant material, such as tungsten, copper or a tungsten alloy. In order to provide cooling of the tip, thus extending its life, during use of the reactor, the tip may optionally be hollow and comprise a plurality of apertures extending thereabout. The gas flowing between the gas inlet and the gas outlet of the resonant cavity can pass through the apertures to cool the tip. Each of the apertures preferably has a diameter sized to enable the microwave radiation to pass therethrough.

The electrically conducting member preferably comprises an electrically conducting body portion engaging the tip. An annular coolant channel may be provided, the annular channel extending about the electrically conducting body portion, with means being provided for conveying a coolant to and from the annular channel.

The electrically conducting body portion preferably comprises a gas inlet port for receiving a reactant for reacting with a gas conveyed through the resonant cavity, the electrically conducting body portion preferably comprising a passageway for conveying the reactant into the resonant cavity. When the reactor is provided as part of a plasma abatement system, depending on the composition of the gas to be abated and which is conveyed through the chamber, it can be advantageous to introduce a reactant into the resonant cavity for reacting with the gas to be abated. For example, when the gas to be abated is a perfluorinated or hydrofluorocarbon compound, for example, one of $CF_4$, $C_2F_6$, $CHF_3$, $C_3F_8$, $C_4F_8$, $NF_3$ and $SF_6$, a reactant such as $H_2$ or $H_2O$ may be conveyed into the resonant cavity through a bore of the electrically conducting member to form H or OH radicals within the plasma for reacting with the gas to be abated.

The electrically conducting member is preferably located opposite the gas outlet. The gas inlet preferably extends through said at least one dielectric insert, and is preferably arranged to introduce gas into the gas chamber substantially tangentially. This encourages the gas to spiral within the chamber and achieve a uniform pressure drop in the gas beneath the tip to optimise the plasma. The reactor chamber preferably comprises a transparent inspection window located in a sidewall thereof, said at least one dielectric insert having a bore formed therein extending between the gas chamber and the window.

The presence of the electrically conducting member within the electric field may disturb the impedance matching between the waveguide and the resonant cavity, and this can lead to reflection of microwave radiation back through the waveguide towards the microwave generator, and thus reduce the energy absorption into the plasma. If the reflected energy is too high, the microwave generator may be damaged. Therefore, a tuner may be provided co-axial with the electrically conducting member so that the impedance in the plane of the electrically conducting member matches the impedance of the waveguide at the frequency of the microwave radiation.

The electrically conducting member is preferably held within a holder mounted on the chamber. The chamber preferably comprises a cylindrical bore located adjacent the resonant cavity, with the holder extending into the bore. Both the holder and the chamber are preferably formed from electrically conducting material, with the holder making electrical contact with the chamber. The holder preferably comprises an outwardly extending skirt that is mounted on the chamber to form a gas-tight seal between the chamber and the holder. The skirt may make electrical contact with the chamber. Otherwise, an annular ring depending downwardly from the skirt may make electrical contact with the chamber. The distance between the base of the skirt and the end of the electrically conducting member is preferably chosen to maximise the electromagnetic field within the resonant cavity. The holder preferably comprises an elongate body portion having a conical projection for retaining the tip of the electrically conducting member therein.

The electrically conducting member may house means for igniting a plasma within the resonant cavity. The means for igniting the plasma preferably comprises means for generating a glow discharge, which preferably comprises an elongate electrode located within the electrically conducting member. A glow-discharge gas is preferably conveyed to the electrode for forming the glow discharge, the electrically conducting member providing a passageway for enabling the glow-discharge gas to convey the glow discharge to the resonant cavity for ignition of the plasma therein. The glow-discharge gas may be nitrogen or a noble gas or any other substantially inert and ionisable gas. When a reactant is required for reacting with the gas conveyed through the resonant cavity, the reactant may be contained within the glow-discharge gas.

Circuitry may be provided for providing a voltage sufficiently high to initiate the glow discharge and for sustaining the glow discharge, preferably for at least 0.1 seconds. Generation of the glow discharge may be ceased after the plasma is ignited within the resonant cavity; thus the glow discharge may generated for up to 10 seconds or for example for up to 5 seconds, for example for from 1 to 5 seconds.

The reactor preferably comprises a microwave generator for generating the microwave radiation. As an alternative to providing a means for igniting the plasma, the generator may be configured to generate the microwave radiation at a power sufficient to ignite a plasma within the resonant cavity, for example, between 2 and 6 kW. The generator may be configured to reduce the power at which the microwave radiation is generated, for example, to between 2 and 3 kW, after a predetermined period of time, for example for from 1 to 5 seconds.

The present invention also provides apparatus for treating a gas stream exhaust from a process tool, the apparatus comprising a microwave plasma reactor as aforementioned.

While the foregoing description and drawings represent the preferred embodiments of the present invention, it will be apparent to those skilled in the art that various changes and modifications may be made therein without departing from the true spirit and scope of the present invention.

We claim:

1. A microwave plasma reactor comprising:
   a reactor chamber;
   a microwave resonant cavity located within the reactor chamber, wherein the microwave resonant cavity comprises a gas inlet and a gas outlet;
   a waveguide for conveying microwave radiation to the microwave resonant cavity, the waveguide having a convergent tapered portion and connected to one end of the resonant cavity;
   means for forming an electromagnetic standing wave within the microwave resonant cavity from the microwave radiation for initiating and sustaining a plasma within the microwave resonant cavity; and
   conduit means extending from the gas outlet for containing a plasma conveyed from the resonant cavity with a gas flowing from the gas inlet to the gas outlet, and
   an electrically conductive member comprising a replaceable tip protruding into the resonant cavity and located at a maximum intensity of the electromagnetic field formed within the resonant cavity during use of the microwave plasma reactor, the tip intensifying the electric field within the microwave resonant cavity, wherein the microwave resonant cavity further comprises at least one dielectric insert, wherein the at least one dielectric insert comprises a bore fluidly connected to the gas inlet and located in a propagation path of the microwave radiation along the waveguide, and defines a substantially cylindrical gas chamber for receiving gas from the gas inlet and conveying gas to the gas outlet, and wherein the gas outlet is substantially co-axial with the gas chamber, and the gas inlet is substantially tangential to the gas chamber.

2. The microwave plasma reactor of claim 1, wherein the convergent tapered portion of the waveguide has a first substantially rectangular first end surface at one end thereof, a second substantially rectangular first end surface at the other end thereof proximate the microwave resonant cavity, and a height orthogonal to the direction of propagation of microwave radiation therethrough, and wherein the height of the convergent tapered portion of the waveguide decreases from the first end portion to the second end portion.

3. The microwave plasma reactor of claim 2, wherein the convergent tapered portion of the waveguide comprises two convergent side surfaces each extending between and being inclined at an acute angle to the first end surface.

4. The microwave plasma reactor of claim 2, wherein the height of the first end portion is approximately three times that of the second end portion.

5. The microwave plasma reactor of claim 2, wherein the height of the second end portion is approximately equal to the height of the microwave resonant cavity.

6. The microwave plasma reactor of claim 1, wherein the tapered portion of the waveguide is located adjacent to the reactor chamber.

7. The microwave plasma reactor of claim 1, wherein the convergent tapered portion of the waveguide has a length in the direction of propagation of microwave radiation therethrough equal to approximately one half of the wavelength of the microwave radiation.

8. The microwave plasma reactor of claim 1, wherein the waveguide comprises a first body portion and a second body portion from which microwave radiation propagating therethrough enters the microwave resonant cavity, the convergent tapered portion of the waveguide being located between the body portions of the waveguide.

9. The microwave plasma reactor of claim 1, further comprising means for cooling the conduit means.

10. The microwave plasma reactor of claim 9, wherein the means for cooling the conduit means comprises means for spraying a coolant on to an outer surface of the conduit means.

11. The microwave plasma reactor of claim 1, wherein the means for forming an electromagnetic standing wave within the microwave resonant cavity comprises a second chamber mounted on the reactor chamber opposite the waveguide for receiving the microwave radiation from the microwave resonant cavity and having an end surface extending substantially perpendicular to the direction of propagation of the microwave radiation through the reactor chamber for reflecting the microwave radiation back into the microwave resonant cavity.

12. The microwave plasma reactor of claim 11, wherein the second chamber houses tuning means spaced from the end surface of the second chamber.

13. The microwave plasma reactor of claim 12, wherein the tuning means comprises an electrically conducting tuner extending substantially perpendicular to the direction of propagation of microwave radiation through the second chamber.

14. The microwave plasma reactor of claim 13, wherein the electrically conducting tuner is moveable relative to the second chamber.

15. The microwave plasma reactor of claim 13, wherein the electrically conducting tuner is substantially cylindrical.

16. The microwave plasma reactor of claim 1, wherein the gas outlet extends substantially orthogonal to the direction of propagation of the microwave radiation through the reactor chamber.

17. The microwave plasma reactor of claim 1, wherein the reactor chamber has a circular or elliptical cross-section.

18. The microwave plasma reactor of claim 1, wherein the at least one dielectric insert comprises two dielectric plate members each comprising a curved sidewall portion.

19. The microwave plasma reactor of claim 1, wherein the gas inlet extends through the at least one dielectric insert.

20. The microwave plasma reactor of claim 1, wherein the gas inlet is arranged to introduce gas into the gas chamber substantially tangentially.

21. The microwave plasma reactor of claim 1, wherein the reactor chamber further comprises a transparent inspection window located in a sidewall thereof, the at least one dielectric insert comprising a bore formed therein extending between the gas chamber and the transparent inspection window.

22. The microwave plasma reactor of claim 1, wherein the replaceable tip is hollow and comprises a plurality of apertures extending thereabout.

23. The microwave plasma reactor of claim 22, wherein each aperture of the plurality of apertures defines a diameter sized to enable the microwave radiation to pass therethrough.

24. The microwave plasma reactor of claim 1, wherein the replaceable tip is formed from tungsten, copper or a tungsten alloy.

25. The microwave plasma reactor of claim 1, wherein the electrically conductive member comprises an electrically conductive body portion engaging the replaceable tip.

26. The microwave plasma reactor of claim 25, further comprising:
    an annular coolant channel extending about the electrically conductive body portion; and
    means for conveying a coolant to and from the annular coolant channel.

27. The microwave plasma reactor of claim 26, wherein the electrically conductive body portion comprises a gas inlet port for receiving a reactant for reacting with a gas conveyed through the microwave resonant cavity, the electrically conductive body portion comprising a passageway for conveying the reactant into the microwave resonant cavity.

28. The microwave plasma reactor of claim 1, wherein the electrically conductive member extends into the electromagnetic field substantially perpendicular to the direction of propagation of the microwave radiation through the reactor chamber.

29. The microwave plasma reactor of claim 1, wherein the electrically conductive member is located opposite the gas outlet.

30. The microwave plasma reactor of claim 1, wherein the electrically conductive member houses means for igniting a plasma within the microwave resonant cavity.

31. The microwave plasma reactor of claim 1, further comprising a microwave generator for generating the microwave radiation, the microwave generator being configured to generate the microwave radiation at a power sufficient to initiate a plasma within the microwave resonant cavity.

32. The microwave plasma reactor of claim 31, wherein the microwave generator is configured to reduce the power at which the microwave generator generates the microwave radiation after a predetermined period of time.

* * * * *